United States Patent [19]

Forward et al.

[11] 4,352,982

[45] Oct. 5, 1982

[54] PHOTODIODE CIRCUIT USING A LOW NOISE ARTIFICIAL LOAD RESISTOR

[75] Inventors: Robert L. Forward, Oxnard; Gary D. Thurmond, Thousand Oaks, both of Calif.

[73] Assignee: Hughes Aircraft Company, Culver City, Calif.

[21] Appl. No.: 180,078

[22] Filed: Aug. 21, 1980

[51] Int. Cl.³ .............................................. H01J 40/14
[52] U.S. Cl. .................................. 250/214 A; 307/311
[58] Field of Search ....................... 250/214 A, 214 R; 307/311

[56] References Cited

U.S. PATENT DOCUMENTS 3,333,106  7/1967  Fischer ........................ 250/214 A X
3,604,941  9/1971  Crum ........................... 250/214 R X
3,790,288  2/1974  Hostetter ...................... 250/214 R X

*Primary Examiner*—David C. Nelms
*Assistant Examiner*—Edward P. Westin
*Attorney, Agent, or Firm*—William J. Benman, Jr.; William H. MacAllister

[57] ABSTRACT

An improved photodector which in utilizing a low noise load network instead of a resistor has the advantages in signal-to-noise ratio of a large load resistance without the deleterious effect on response time. The circuit includes a conventional photodiode with an operational amplifier at its output. The load network is disposed in the feedback path of the operational amplifier. It consists of a second operational amplifier, a fixed resistor and a variable resistor.

1 Claim, 4 Drawing Figures

PHOTODIODE CIRCUIT USING A LOW NOISE ARTIFICIAL LOAD RESISTOR

BACKGROUND OF THE INVENTION

1. Field of the Invention

This invention relates to photodetector circuits. More specifically, this invention relates to an improvement in photodetector circuits that provides a low noise photodetector with a nominal response time.

While the present invention is described herein with reference to particular embodiments, it is to be understood that the it is not limited thereto. Modifications to the present invention may be made by those having ordinary skills in the art and access to the teachings of this invention without departing from the true spirit and scope thereof.

2. Description of the Prior Art

Many electrical circuits require a load network to facilitate the delivery of an electrical signal. The load network may be any combination of resistors, capacitors, inductors, or other electrical components. The impedance of the network may be chosen to optimize the performance of the circuit.

Invariably, the load network operates to reduce the signal-to-noise ratio (S/N) of the circuit. This deleterious effect can be minimized by judicious design of the load network with careful attention to its input impedance. This presents a design constraint which imposes tradeoff considerations. For example, in a photodetector circuit, where a resistor is typically utilized as a load, it is well known that to minimize the effect on the S/N ratio the impedance of the resistor must be large relative to that of the photodetector. Unfortunately, a large load resistor in a photodetector circuit operates to slow the response time of the circuit or reduce its bandwidth. Thus, it is an object of the present invention to provide a photodetector circuit with an improved S/N ratio and minimal degradation in response time.

In applicants U.S. Pat. No. 4,156,859, issued May 29, 1979 and 4,176,331, issued Nov. 27, 1979 there are disclosed classes of two-terminal active networks which simulate low-noise resistors. These circuits utilize a differential-input operational amplifier which senses the port input current and in response thereto generates a port output voltage. In this fashion a simulated resistor can be obtained. These simulated resistors are given the coined name "absorbor" with the "or" ending chosen to match the ending of other circuit components such as "resistor" and "inductor".

SUMMARY OF THE INVENTION

The above and other objects of the present invention are accomplished by a photodetector circuit designed to incorporate an absorbor as a load. The present invention includes a photodiode which is coupled to an operational amplifier. A load network is disposed in the feedback path of the operational amplifier. It includes a second operational amplifier and a resistor connected between the output and a first input terminal of the second amplifier. A variable resistor is also provided. Its fixed resistance is connected between the output and a second input to the second operational amplifier. The first input terminal to the amplifier and the variable resistance terminal of the resistor provide the single port of the load network. The output of the first operational amplifier provides the output for the photodetector circuit.

DETAILED DESCRIPTION OF THE INVENTION

Figure 1:
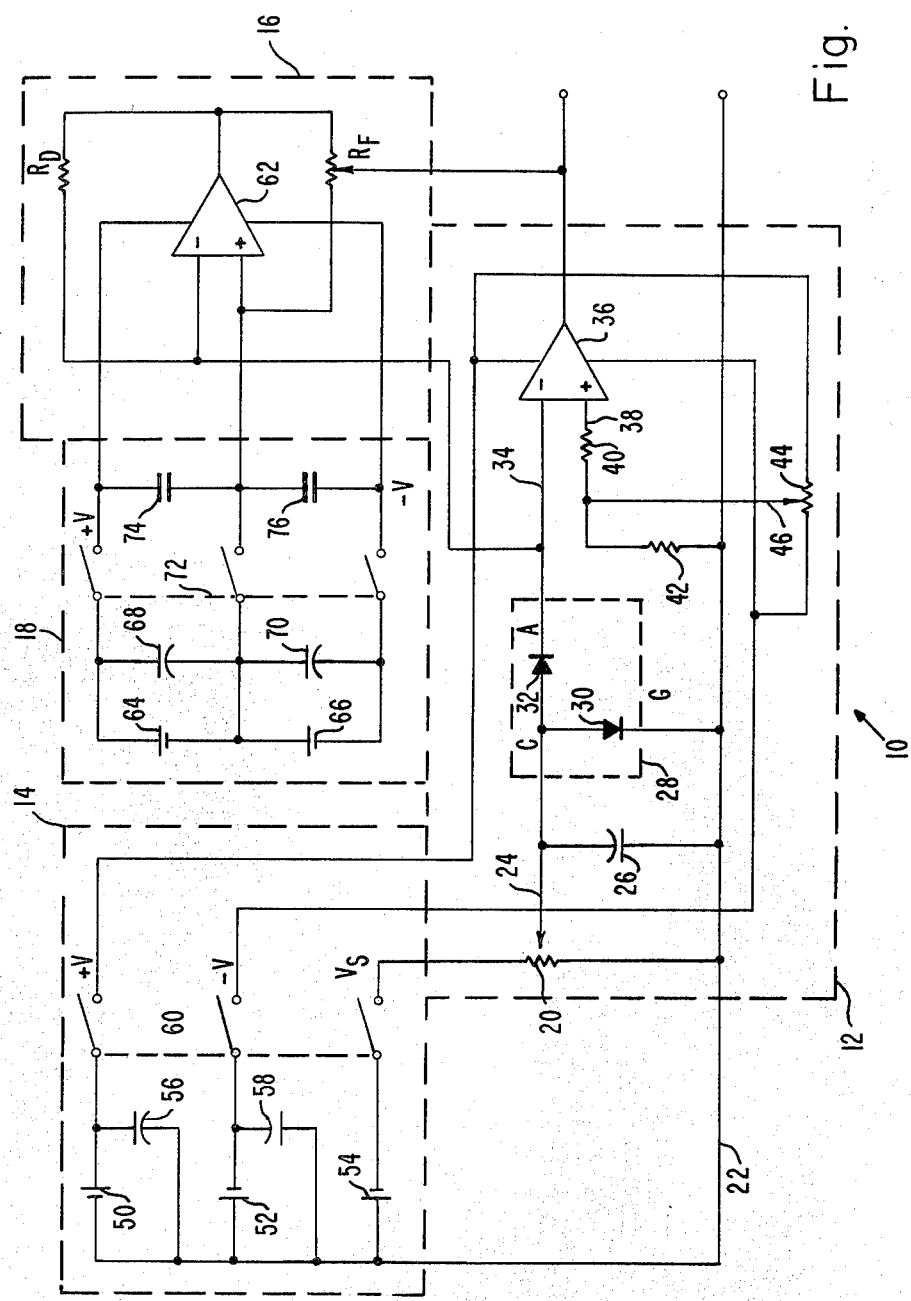
FIG. 1 is a schematic diagram of the photodetector circuit of the present invention.

The present invention will now be described with reference to the above-identified drawings wherein like referenced numerals denote like elements. In FIG. 1 there is shown a schematic diagram of a photodetector circuit with a low-noise absorbor network providing the equivalent feedback or load resistance. In the schematic diagram of FIG. 1 the photodetector circuit 10 is shown with the photodiode circuit 12 operatively connected to the associated power supply circuit 14. The absorbor or load network 16 is in the feedback path of the photodiode circuit 12 and has operable connections to a second power supply circuit 18.

The photodiode circuit 12 includes a variable resistor 20 having fixed resistor terminals disposed between the $V_s$ terminal of the power supply 14 and the line 22. The variable resistance terminal 24 of the resistor 20 is coupled to line 22 by capacitor 26. Variable resistor 20 and capacitor 26 cooperate to provide proper biasing for the photodiode 28. In the preferred embodiment, the photodiode 28 is an SGD-100 A silicon diffused pin photodiode manufactured by the EG & G Company, Electro Optics Division. It should be noted here that the photodiode 28 could be replaced by any number of currently available photodiodes without departing from the true spirit and scope of the present invention.

As shown in FIG. 1, the photodiode 28 includes elements 30 and 32. Diode element 32 which is the main sensing diode is disposed between the variable resistance terminal 24 of the resistor 20 and the battery common line 22. The second diode 30 which is a guard ring for the main sensing diode. It is disposed between the variable resistance terminal 24 and a first input terminal 34 of the operational amplifier 36. Diode 30 prevents noise due to electrical fringing fields.

The second input 38 of the operational amplifier 36 is connected to line 22 via resistors 40 and 42. A variable resistor 44 is disposed between the output terminals of the power supply 14. The variable resistance terminal 46 of the resistor 44 is connected to the common node between resistors 40 and 42 to provide a variable offset adjustment for the photodiode circuit 12. The operational amplifier 36 is shown with operative +V connections to the power supply 14.

The power supply 14 for the operational amplifier 36 includes batteries 50, 52 and 54. Battery 50 is shunted by capacitor 56 and provides the +V voltage. Battery 52 is shunted by capacitor 58 and provides a −V voltage. Battery 54 provides a $V_s$ voltage. The batteries are coupled to the photodiode circuit 12 by triple-pole single-throw switch 60. Thus batteries 50 and 52 provide a power supply for the operational amplifier 36 while battery 54 provides biasing for the photodiode 28.

The low-noise network 16 is disposed in the feedback path of the operational amplifier 36 and includes a second operational amplifier 62 having a fixed resistor $R_d$ in one feedback path and variable resistor $R_f$ in another. The variable resistance terminal of resistor $R_f$ is connected to the output of the operational amplifier 36. The inverting input of the operational amplifier 36 is connected to the inverting input of the operational amplifier 62. Effectively the operational amplifiers are in cascade.

Power supply 18 provides biasing for the operational amplifier 62. It includes batteries 64 and 66 which are shunted by electrolytic capacitors 68 and 70 respectively. A triplepole single-throw switch 72 couples the batteries to the operational amplifier 62. Capacitor 74 is disposed between the +V terminal of the power supply 18 and the differential input to the operational amplifier 62. Similarly, capacitor 76 is connected between the −V terminal of the power supply 18 and the differential input to the operational amplifier 62.

It should be noted here that the power supply circuits 14 and 18 are substantially identical. They may be replaced by any number of currently available power supplies without departing from the true spirit and scope of the present invention. However, they cannot be combined into a single power supply or have a common ground return since power supply 18 must be floated with respect to power supply 14.

The output of the photodetector circuit 10 appears between the output of the operational amplifier 36 and line 22. The low-noise network 16 in the feedback path of the operational amplifier 36 operates to provide the equivalent resistance necessary for proper operation of the photodiode circuit 12. The network 16 has a minimal adverse effect on the bandwidth and signal-to-noise ratio of the circuit 12. This is evident from the following analysis in which the S/N of the photodiode 28 is calculated and subsequently compared to the S/N at the output of the amplifier 36 with a feedback load resistor $R_L$. The S/N of the circuit 12 with the load resistor $R_L$ is then compared to the S/N of the circuit 12 with the low noise load network 16 of the present invention.

Figure 2:
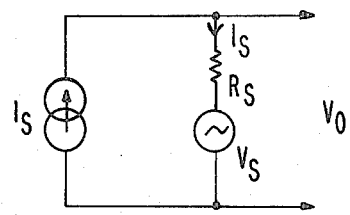
FIG. 2 is a schematic diagram of the equivalent noise circuit of a conventional photodiode.

The S/N ratio of the photodiode 28 represents the upper limit of the S/N ratio of the entire circuit with or without the network 16 of the present invention. For the purpose of analysis, the photodiode circuit 12 without the operational amplifier 36 and associate biasing resistors 40, 42 and 44 can be represented by the equivalent circuit of FIG. 2. In FIG. 2 there is shown an equivalent current source $I_s$ which represents the photocurrent induced in the photodiode by the photons. The photodiode 28 has an equivalent resistance $R_s$ which in turn has an associated Johnson noise voltage generator represented by the voltage source $V_s$. The voltage source $V_s$ is connected in series with the equivalent resistance $R_s$ in a path parallel to the current source $I_s$. Thus the output voltage $V_o$ can be given by the equation:

$$V_o = I_s R_s + V_s \quad [1]$$

where $I_s R_s$ represents the signal component of the output voltage and $V_s$ represents the noise component. $V_s$ was determined from the research of Johnson and Nyquist in the late 1920's to be given by:

$$V_s = (4kTBR_s)^{\frac{1}{2}} \quad [2]$$

where k is Boltzmann's constant ($1.38 \times 10^{-23}$ joules per °K.), T is the absolute temperature of the photodiode in °K., $R_s$ is the resistance of the photodiode 28 and B is the bandwidth of measurement in Hz. The signal-to-noise power ratio of the photodiode itself is given by the ratio of the square of the signal voltage $I_s R_s$ divided by the square of the noise voltage $V_s$, thus:

$$(S/N)_p^2 = \frac{I_s^2 R_s^2}{4kTBR_s} = \frac{I_s^2 R_s}{4kTB} \quad [3]$$

Figure 3:
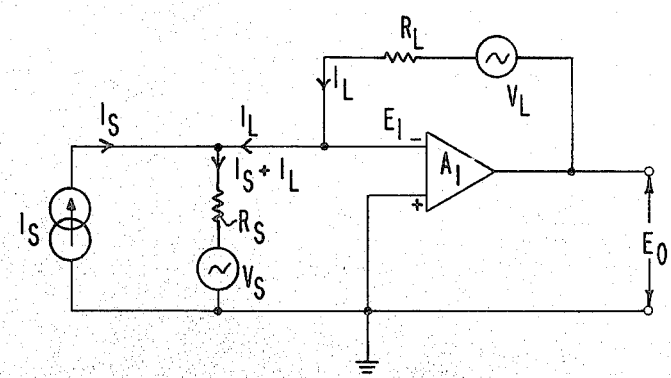
FIG. 3 is a schematic diagram of the equivalent noise circuit of the photodiode of FIG. 2 connected to an operational amplifier having a feedback resistor $R_L$.

If the photodiode 28 is connected to the operational amplifier 36 with a feedback load resistor $R_L$ having a noise $V_L$ equal to $(4kTBR_L)^{\frac{1}{2}}$, it can be represented by the equivalent circuit shown in FIG. 3.

A signal and noise analysis of the circuit in FIG. 3 yields the following equation for the output voltage $E_o$ for high amplifier gain A $$E_o = -I_s R_L + V_L - \frac{R_L V_s}{R_s} \quad [4]$$

which consists of the signal voltage $I_s R_L$ and the two noise voltages.

The squared signal voltage is:

$$S^2 = I_s^2 R_L^2, \quad [5]$$

And the sum of the squared noise voltages is:

$$N^2 = V_L^2 + (R_L/R_s)^2 V_s^2 = 4kTBR_L(1 + R_L/R_s). \quad [6]$$

The squared signal-to-noise ratio of the circuit of FIG. 3 is then:

$$(S/N)_{RL}^2 = \frac{I_s^2 R_L^2}{4kTBR_L(1 + R_L/R_s)} \quad [7]$$

$$(S/N)_{RL}^2 = \frac{R_L}{R_L + R_s} \cdot \frac{I_s^2 R_s}{4kTB} \quad [8]$$

$$(S/N)_{RL}^2 = \frac{R_L}{R_L + R_s} \left(\frac{S}{N}\right)_p^2. \quad [9]$$

It is apparent that the S/N ratio at the output of the amplifier 36 where a feedback resistor $R_L$ has replaced the network 16, is given by equation [9] above and is always less than the original S/N ratio of the photodiode 28 as given by the equation [3]. If the feedback resistor $R_L$ is equal to the inherent resistance $R_s$ of the photodiode 28, the S/N power ratio is down a factor of 2 (or 3 dB). Of course, the amplifier S/N ratio will approach the photodiode 28 S/N ratio if $R_L$ is large enough relative to $R_s$. However, as mentioned above, utilizing a large load resistor $R_L$ operates to substantially reduce the response time of the photodetector 10.

Now, the S/N ratio of the amplifier 36 will be calculated with the network 16 in the feedback path in place of the load resistor $R_L$ where the network 16 has been adjusted to provide the same equivalent resistance $R_{eq}$ as the load resistor $R_L$. The equivalent resistance as previously derived in U.S. Pat. No. 4,176,331 equation [2] can be represented by the following equation:

$$R_{eq} = R_L = \frac{R_{F2}}{R_{F1} + R_{F2}} (R_D + R_{F1}) \quad [10]$$

Where $R_{F1} + R_{F2} = R_F$ and $R_{F1}$ is that part of $R_F$ between the output of amplifier 30 and the output of amplifier 62; while $R_{F2}$ is that part of $R_F$ between the output of amplifier 36 and the noninverting input of amplifier 62.

For the purpose of simplification, let:

$$K = \frac{R_{F2}}{R_{F1} + R_{F2}} \quad [11]$$

Since normally $R_D >> R_{F1} >> R_{F2}$, this reduces to:

$$R_{eq} = R_L \approx KR_D \quad [12]$$

Figure 4:
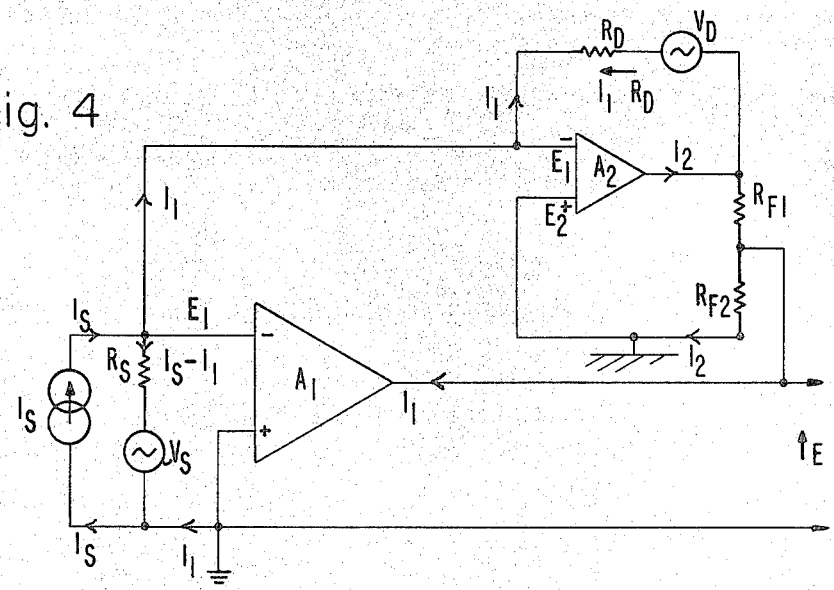
FIG. 4 is a schematic diagram of the equivalent noise circuit of FIG. 1.

The S/N of the circuit of FIG. 1 will now be determined. The equivalent noise circuit is shown in FIG. 4. (Note that neither the positive or the negative input of A$_2$ is at ground potential and that the power supply of amplifier A$_2$ is floating with respect to the power supply of amplifier A$_1$. Analysis of the circuit of FIG. 4 yields the following equation for the output voltage E$_o$ when both A$_1$ and A$_2$ have high gain.

$$E_o = -K(R_D + R_{F1})I_s - K\frac{R_D + R_{F1}}{R_s}V_s - KV_D$$

where again we used the relationship of equation 11 for simplification. The signal voltage is $K(R_D + R_{F1})I_s$ while the other two components are the transformed noise voltages of $V_s$ and $V_D$.

The above discussion has preceded on the basis whereby the noise in the operational amplifiers and in resistors R$_F$ and R$_X$ was ignored. This noise is not significant for the purpose of the analysis for large R$_D$ and moderate K.

The squared signal is:

$$S^2 = K^2(R_D + R_{F1})^2 I_s^2 \quad [14]$$

The squared noise is the sum of the squares of the two uncorrelated noise sources:

$$N^2 = K^2 \frac{(R_D + R_{F1})^2}{R_s^2} V_s^2 + K^2 V_D^2 \quad [15]$$

$$N^2 = K^2 \frac{(R_D + R_{F1})^2}{R_s^2} 4kTBR_s + K^2 4kTBR_D \quad [16]$$

Since the equivalent resistance of the absorbor is given by:

$$R_{eq} = R_L = \frac{R_{F1}}{R_{F1} + R_{F2}} (R_D + R_{F1}) \quad [10]$$

$$R_{eq} = K(R_D + R_{F1}) \approx KR_D \quad [12]$$

Then the S/N equations reduce to:

$$S^2 = R_L^2 I_s^2 \quad [17]$$

and $$N^2 = 4kTB\left(\frac{R_L^2}{R_s} + KR_L\right) \quad [18]$$

And the S/N ratio of the circuit of FIG. 10 using the network 16 of the present invention having an equivalent resistance of R$_L$ for feedback becomes:

$$\left(\frac{S}{N}\right)^2_{absorbor} = \frac{I_s^2 R_L}{4kTB(R_L/R_s + K)} \quad [19]$$

$$\left(\frac{S}{N}\right)^2_{absorbor} = \frac{R_L}{R_L + KR_s} \cdot \frac{I_s^2 R_s}{4kTB} \quad [20]$$

$$\left(\frac{S}{N}\right)^2_{absorbor} = \frac{R_L}{R_L + KR_s} \left(\frac{S}{N}\right)^2_P \quad [21]$$

Thus, provided K is small, then an amplifier using an absorber has almost the same signal-to-noise ratio as the photodiode—no matter whether the equivalent resistance R$_L$ is larger or smaller than the photodiode source resistance R$_S$.

From another point of view, equation 21 can be arranged as follows:

$$\left(\frac{S}{N}\right)^2_{absorbor} = \frac{R_L + R_s}{R_L + KR_s} \cdot \frac{R_L}{R_L + R_s} \cdot \left(\frac{S}{N}\right)^2_P \quad [22]$$

or $$\left(\frac{S}{N}\right)^2_{absorbor} = \frac{R_L + R_s}{R_L + KR_s} \left(\frac{S}{N}\right)^2_{RL} \quad [23]$$

For small K, this reduces to:

$$\left(\frac{S}{N}\right)^2_{absorbor} = \left(1 + \frac{R_s}{R_L}\right) \cdot \left(\frac{S}{N}\right)^2_{RL} \quad [24]$$

Since $(1 + R_s/R_L)$ is always greater than 1, it is obvious that using an absorbor 16 instead of a resistor R$_L$ always improves the signal-to-noise ratio. If R$_S \approx$ R$_L$ then the improvement is a factor of two in power gain or 3 dB. Of course, if R$_L >>$ R$_S$, then the improvement is less, but there is always some improvement.

A particular embodiment of the present invention has been disclosed herein. However, it is contemplated that one having ordinary skill in the art and access to the teachings of the present invention would be able to modify the disclosed embodiment in a manner within the true spirit and scope the invention. It is therefore contemplated by the appended claims to cover any and all such modifications.

What is claimed is:

1. An improved photodiode circuit using a low noise artificial load resistor, said circuit comprising:
   power supply means;
   a first operational amplifier having first and second input terminals;

a photodiode connected between said first input terminal of said first operational amplifier and said power supply means;

variable resistive means connected between said second input terminal of said first operational amplifier and said power supply means; and a two-terminal network connected between the output terminal and said first input terminal of said first operational amplifier, having an equivalent resistance $R_{eq}$ and comprising:

a second operational amplifier with first and second input terminals and an output terminal, said first input terminal of said second amplifier being connected to said first input terminal of said amplifier;

a first resistor $R_D$ connected between said first input terminal and said output terminal of said second amplifier;

a second resistor $R_F$ having a variable resistance terminal and first and second fixed resistance terminals, said first fixed resistance terminal being connected to said second input terminal of said second operational amplifier and said power supply means, and said second fixed resistance terminal connected to said output terminal of said second operational amplifier and said variable resistance terminal being connected to the output terminal of said first amplifier which is also the output of said photodiode circuit;

whereby said variable resistor $R_F$ may be adjusted to change $R_{eq}$ and to make the signal to noise ratio of said photodiode circuit substantially independent of the value of $R_{eq}$.

* * * * *